(12) United States Patent
Koyama

(10) Patent No.: US 6,490,021 B1
(45) Date of Patent: Dec. 3, 2002

(54) REFLECTIVE TYPE SEMICONDUCTOR DISPLAY DEVICE

(75) Inventor: Jun Koyama, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/298,700

(22) Filed: Apr. 23, 1999

(30) Foreign Application Priority Data

Jun. 17, 1998 (JP) ............................................ 10-169711

(51) Int. Cl.[7] .......................... G02F 1/136; G02F 1/133; G09F 9/30; H01L 29/786
(52) U.S. Cl. ........................... 349/139; 349/43; 349/151
(58) Field of Search ............................... 349/13, 5, 12, 349/43, 48, 139, 149, 151; 345/92, 206, 211, 901; 257/59, 72

(56) References Cited

U.S. PATENT DOCUMENTS 5,589,406 A * 12/1996 Kato et al. .................... 437/21
5,790,213 A    8/1998 Sasaki et al.
5,811,837 A * 9/1998 Misawa et al. ............. 345/205
6,292,183 B1 * 9/2001 Yamazaki et al. ............. 345/92
6,384,818 B1    5/2002 Yamazaki et al. .......... 345/206

FOREIGN PATENT DOCUMENTS

JP         10-104663        4/1998

* cited by examiner

*Primary Examiner*—William L. Sikes
*Assistant Examiner*—Tai V. Duong
(74) *Attorney, Agent, or Firm*—Fish & Richardson P.C.

(57) ABSTRACT

A reflective type active matrix liquid crystal display device is provided which is capable of offering preferred images. The present invention provides a reflective type display device comprising an insulation substrate, a TFT array formed over the insulation substrate and having a plurality of pixel TFTs formed in a matrix form, at least one driver circuit formed over the substrate and having a plurality of driver TFTs to drive the TFT array, a reflective pixel electrode connected to the pixel TFTs and arranged above part or an entire of the driver circuit, and at least one power source interconnect connected to the driver circuit and formed between the reflective pixel electrode and one of a source electrode and a drain electrode of the driver TFTS. This power source interconnect serves to shield against electrical noise caused by the driver TFTs constituting the driver circuit.

31 Claims, 8 Drawing Sheets

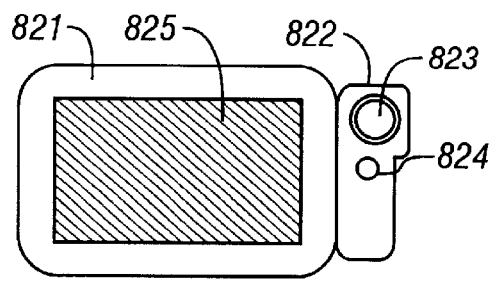
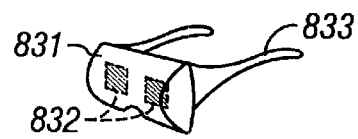
FIG. 8C
FIG. 8D
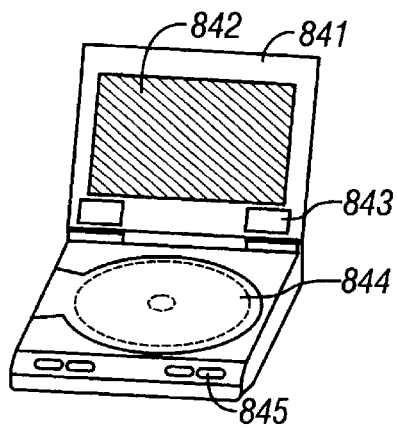
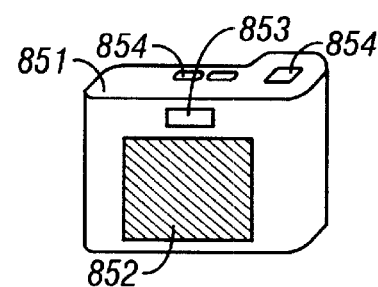
FIG. 8E
FIG. 8F
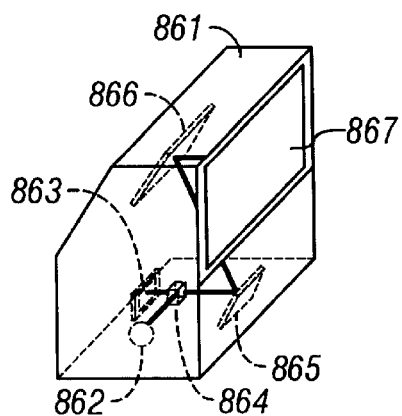
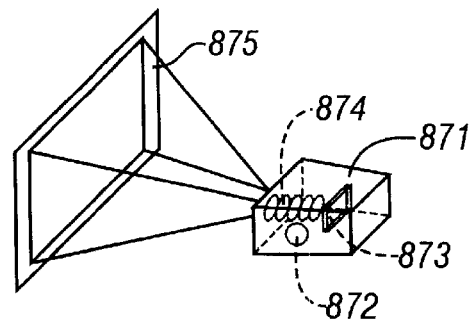
FIG. 8G
FIG. 8H

REFLECTIVE TYPE SEMICONDUCTOR DISPLAY DEVICE

BACKGROUND OF THE INVENTION

1. Field of the Invention

The present invention relates to reflective type semiconductor display devices. More particularly, the invention relates to a reflective type active matrix liquid crystal display device using a display medium. The reflective type semiconductor display device of the invention, however, may use any of other display mediums with which modulation in optical property can be made responsive to a voltage applied to the display medium (for example, an elecroluminescent device, etc.).

2. Description of the Prior Arts

Recently, advancement has being made for the technology to manufacture a semiconductor device, such as with thin film transistors (TFTs), on an inexpensive glass substrate. The reason of this lies in increase of demand for active matrix liquid crystal display devices (liquid crystal panels).

The active matrix liquid crystal panel has pixel TFTs which are arranged in respective pixels in number of from several hundreds to several millions to form TFT array so that electric charge can be controlled of input to and output from each pixel electrode through TFT switch function.

The TFT array includes thin film transistors utilizing amorphous silicon formed over a glass substrate.

Meanwhile, there has been recent realization of active matrix liquid crystal display devices utilizing a quartz substrate to form polycrystalline silicon thin film transistors. This structure can afford to form driver circuits for driving TFTs on the same substrate as the TFT array.

Furthermore, there is a known technology of utilizing laser annealing or the like, in order to form thin film transistors using a crystalline silicon film on a glass substrate. This technology, if utilized, can integrate the TFT array together with the driver circuits on a glass substrate.

In recent years, active matrix liquid crystal display devices have been frequently utilized on notebook personal computers. The personal computers require a multi-tone liquid crystal display device to simultaneously start a plurality of software or process images fetched from a digital camera.

Furthermore, recently there has been recent demand for an active matrix liquid crystal display device that is small in size but high in definition, resolution and image quality, as become popular the portable intelligence terminals, mobile computers, car navigators.

The drive to the active matrix liquid crystal device used on the portable intelligence terminal or mobile computer is based on a battery, hence requiring low power consumption. Under such a circumstance, the reflective type active matrix liquid crystal devices drawn attentions toward the mobile computer application and the like. The reflective type active matrix liquid crystal display devices are low in power consumption because, as one reason, of the unnecessity of backlight, unlike the transparent type active matrix liquid crystal display devices.

It is needless to say that the active matrix liquid crystal display devices for mobile computers or the like has to be made as small as possible. There is a recent attempt to form driver circuits to drive the TFT array on a same substrate as the TFT array.

Furthermore, attentions are drawn to an SOP (System On Panel) structure built on a same substrate with control circuits, including a processor circuit, memory circuit, A/D (D/A) converter circuit, correction circuit (gamma correction circuit) and pulse oscillation circuit, besides the driver circuits (shift register circuit, buffer circuit, etc.) for driving pixel TFTs constituting the TFT array.

One example of an active matrix liquid crystal display device structure is herein shown in FIG. 9. FIG. 9 shows only an active matrix substrate for an active matrix liquid crystal display device, wherein 901 is an active matrix substrate, 902 and 903 are source drivers, 904 and 905 are gate drivers, and 906 is TFT array. Incidentally, the active matrix substrate 901 basically uses an insulation substrate such as a glass or quartz substrate.

The active matrix substrate shown in FIG. 9 has two source drivers and two gate drivers. This is due to a structure to drive odd-numbered source signal lines by the source driver 902 and drive even-numbered source signal lines by the source driver 903. Also, the gate drivers on left and right are formed in a redundant structure.

Note that the TFT array 906 includes a plurality of pixel TFTs arranged in a matrix form.

Also, the source drivers 902 and 903 includes a shift register circuit, level shifter circuit, buffer circuit and sampling circuit. The level shifter circuit is a circuit to amplify a drive voltage.

For example, where the shift register circuit is on 10 V drive and the buffer circuit is 16 V drive, voltage has to be converted by the level shifter circuit. There are cases that the shift register circuit be substituted by a combination of counter and decoder circuits.

On the other hand, the gate driver includes a shift register circuit, level shifter circuit, buffer circuit and so on.

Meanwhile, for more complicated structures of active matrix liquid crystal display devices, consideration is made to place other logic circuits in positions as shown at 907 to 910 in FIG. 9. The other logic circuits include a complicate circuit such as a control circuit and processor circuit, and a broad occupation-area circuit such as a memory circuit. It is expected that the total occupation area results in large.

As discussed above, it is a general practice to arrange, on one insulation substrate, a TFT array 906, source drivers 902 and 903, gate drivers 904 and 905, and other logic circuits. Consequently, the occupation area of other than the TFT array has to be reduced to a size as small as possible, in order to secure a display area maximally enlarged for realizing high definition, high resolution and high image quality.

In the structure shown in FIG. 9, however, it is difficult to reduce the occupation area of other than the TFT array. This is one of factors to obstruct the size reduction for the active matrix liquid crystal display devices.

Under such situations, Japanese Laid-Open Patent Publication 10-104663 discloses a structure that, in forming a reflective type active matrix liquid crystal display device including a TFT array, driver circuits and other control circuits on one insulation substrate, the driver circuits and the other control circuits are formed within a region of the TFT array. The Japanese Laid-Open Patent Publication 10-104663 corresponds to a pending U.S. patent application Ser. No. 08/937,377, an entire disclosure of which are incorporated herein by reference.

In the Japanese Laid-Open Patent Publication 10-104663, there are disclosed the TFTs of the driver and control circuits are placed underneath a reflective pixel electrode connected to pixel TFTs of the TFT array.

Here, FIG. 11 shows FIG. 8A of the Japanese Laid-Open patent Publication 10-104663. There is shown in FIG. 11 a sectional view of an active matrix substrate according to a certain embodiment of the Japanese Laid-Open Patent Publication 10-104663. FIG. 11 depicts that interconnects for the driver and control circuits are formed in a layer different from a layer having source and drain electrodes of TFTs for the driver and control circuits (the interconnect denoted at A in FIG. 11). In this structure, however, clock and data signals flowing through the driver and control circuits are passed through the interconnect shown at A. This results in occurrence of electrical noise on the interconnects shown at A, due to the clock and data signals. In brief, it is unavoidable that the electrical noise caused on the interconnect A have adverse effects on pixel electrodes. This leads to disturbance in display images due to such electrical noise, thus making difficult to obtain favorable images.

SUMMARY OF THE INVENTION

Therefore it is an object of the present invention to provide a reflective type active matrix liquid crystal display device which is capable of offering favorable display images.

In accordance with one embodiment of the present invention, a reflective type semiconductor display device comprises: an insulation substrate; a TFT array formed over the insulation substrate, the TFT array having a plurality of pixel TFTs formed in a matrix form; at least one driver circuit formed over the insulation substrate and having a plurality of TFTs to drive the TFT array; wherein part or entire of the driver circuit is arranged underneath reflective pixel electrodes; and the driver circuit having a power source interconnect formed between the reflective pixel electrodes and source electrodes or drain electrodes of the TFTs. This structure achieves the above-described object.

In accordance with another embodiment of the present invention, a reflective type semiconductor display device comprising: an insulation substrate; a TFT array formed over the insulation substrate, the TFT array having a plurality of pixel TFTs formed in a matrix form; at least one driver circuit formed over the insulation substrate and having a plurality of TFTs to drive the TFT array; a logic circuit formed over the insulation substrate; wherein part or an entire of the driver circuit or part or an entire of the logic circuit is arranged underneath reflective pixel electrodes connected to the pixel TFTs; and the driver circuit having a power source interconnect formed between the reflective pixel electrodes and source electrodes or drain electrodes of the TFTs. This structure also achieves the above-described object.

The logic circuit is a memory circuit, a correction circuit, a processor circuit or a signal dividing circuit.

BRIEF DESCRIPTION OF THE DRAWINGS

FIGS. 8A to 8H are views showing examples of semiconductor apparatuses utilizing the semiconductor display devices of the present invention;

DETAILED DESCRIPTION OF THE PREFERRED EMBODIMENTS

In the present invention, a reflective type active matrix liquid crystal display device is structured by integrating over one insulation substrate a TFT array, driver circuits and other control circuits, wherein the TFT array and the driver circuits and other logic circuits are formed in a same region. The driver circuits and the other logic circuits may be collectively referred to as peripheral circuits.

This structure is difficult to provide for a transparent type active matrix liquid crystal display device which needs to secure a light path (opening) for back light or the like. This is because the transparent type active matrix liquid crystal display device has a TFT array and almost all regions of the TFT array is formed by openings. Therefore, it is difficult to form control circuits in the TFT array without decreasing the amount of transmission light.

The preset invention aims to form driver circuits or other logic circuits underneath pixel electrodes functioning as reflective plates for a reflective type active matrix liquid crystal display device having no necessity to secure a light path of back light.

Figure 1:
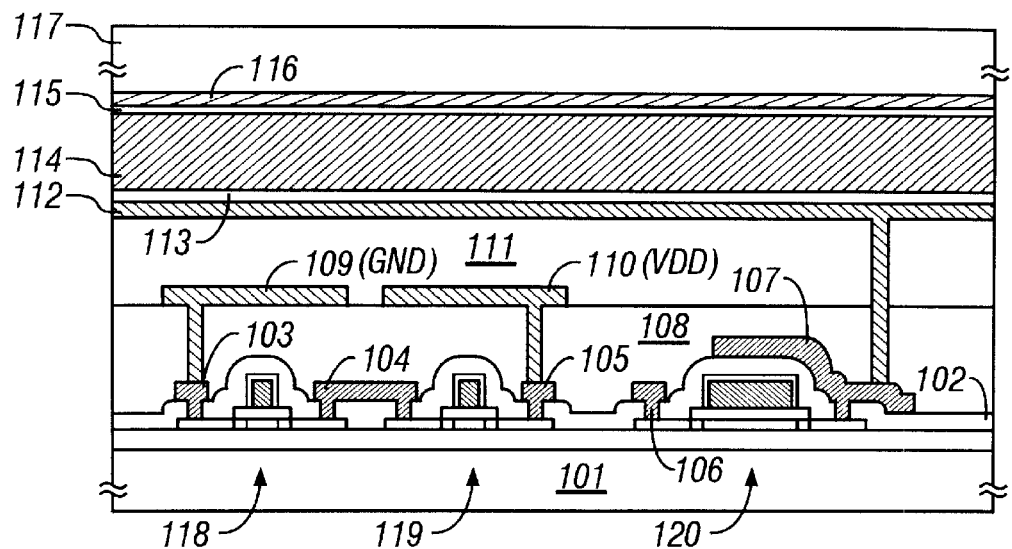
FIG. 1 is a sectional view of an active matrix liquid crystal display device according to a reflective type semiconductor display device of the present invention.

Referring to FIG. 1, there is illustrated a sectional view of a reflective type active matrix liquid crystal display device according to one embodiment of the present invention. Numerals 101 and 117 show substrates, numeral 102 shows a first interlayer insulation film, numerals 103, 104, 105, 106 and 107 show source or drain electrodes, numeral 108 shows a second interlayer insulation film, numerals 109 and 110 show third interconnects, numeral 111 shows a third interlayer insulation film, numeral 112 shows a reflective pixel electrode, numerals 113 and 115 show alignment films, numeral 114 shows liquid crystal, numeral 116 shows an opposite electrode, numerals 118 and 119 show N-channel type and P-channel type driver TFTs and numerals 120 shows a pixel TFT.

A plurality of TFTs are formed over the substrate 101. Herein, TFTs structuring a TFT array are pixel TFTs, and TFTs structuring driver circuits or other logic circuits are driver TFTs, which is constituted by P-channel type driver TFTs and N-channel type driver TFTs.

FIG. 1 shows that one of the N-channel type driver TFT 118 and one of the P-channel type driver TFT 119 are formed underneath the reflective pixel electrode 112 connected to the drain electrode (or a source electrode) 107 of one of the pixel TFTs 120. In FIG. 1, a state is typically illustrated that an N-channel type TFT and a P-channel type TFT constitute a simple CMOS circuit. In practical, a plurality of N-channel type TFTs and P-channel type TFTs constitute for various circuits.

Note that the driver circuits or other logic circuits formed by the P-channel type driver TFTs and the N-channel type driver TFTs may be formed not entirely but partly underneath the reflective pixel electrode.

As shown in FIG. 1, the reflective type active matrix liquid crystal display device of the invention has power source lines or interconnects (VDD or GND) as the third interconnects 109 and 110 which are formed above the second interlayer insulation film 108 and connected to the N-channel driver TFT 118 or the P-channel driver TFT 119 through contact holes. That is, the power source interconnects of the driver circuit are formed between the reflective pixel electrode and the source and drain electrodes of the N-channel driver TFT and the P-channel driver TFT. Meanwhile, interconnects between the N channel driver TFT and the P-channel driver TFT or those between other circuits are formed in a same level layer as the source and drain interconnects or TFT gate interconnects. Consequently, the third interconnects 109 and 110 are supplied with stable voltages without being supplied by a clock signal and a data signal. Therefore, no electrical noise is caused due to the electricity supplied onto the third interconnects 109 and 110. Thus, no influence is given to the reflective pixel electrode 112 positioned above.

Also, electrical noise is caused by the signal flowing through the circuit formed by the driver TFT. This due to clock signal, data signal or the like, as described before. In the present invention, however, such electric noise is shielded by the third interconnects 109 and 110 which are supplied with stable voltages. Thus, the electric noise does not affect the reflective pixel electrode 112. Accordingly, even where the driver circuits are driven by a clock signal of as high as several tens MHz, the reflective pixel electrode is not adversely affected by the electric noise caused on the driver circuits.

According to the present invention, even if the driver circuits or other logic circuits are arranged underneath the pixel electrode, no influence of electrical noise is caused on the reflective pixel electrode, providing favorable images. Incidentally, the above-stated structure and effect is not described in the Japanese Laid-Open Patent Publication 10-104663.

The present invention is concretely explained by the following embodiments. These embodiments, however, are a mere one form of the invention, and the present invention is not limited to these embodiments.

Embodiment 1

Figure 2:
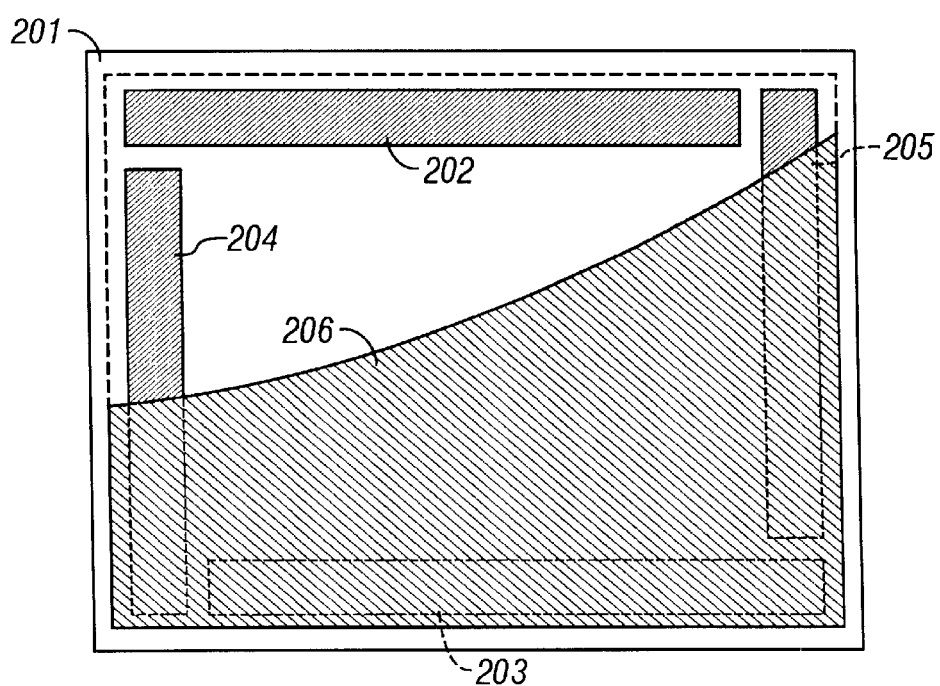
FIG. 2 is a top view of an active matrix substrate of an active matrix liquid crystal display device according to a reflective type semiconductor display device of the present invention.

Referring to FIG. 2, there is illustrated a top plan view of an active matrix substrate of an active matrix liquid crystal display device according to the present embodiment. Note that the figure is partly shown as a projection view for an explanation sake.

In FIG. 2, 201 is an active matrix substrate, 202 and 203 are source driver regions, 204 and 205 are gate driver regions, and 206 is a reflective pixel electrode region connected to a TFT array. In the reflective type active matrix liquid crystal display device of the present embodiment, source driver regions 202 and 203 and the gate driver regions 204 and 205 are formed underneath the reflective pixel electrode region 206, as shown in FIG. 2.

Also, in the present embodiment the source driver region 202 as shown in FIG. 2 has four sides, two of which face respective end faces of the active matrix substrate. One of the remaining sides faces one side of the gate driver region 205. Similarly, the source driver region 203 has four sides, two of which face respective end faces of the active matrix substrate. One of the remaining sides faces one side of the gate driver region 204. The gate driver region 204 has four sides, two of which face respective end faces of the active matrix substrate. On one of the remaining sides faces one side of the source driver region 202. Likewise, the gate driver region 205 has four sides, two of which face respective end faces of the active matrix substrate. One of the remaining sides faces one side of the source driver region 203. With such driver arrangement, size reduction is realized in the reflective type active matrix liquid crystal display device. In this Specification, the driver circuit arrangement as above is referred to as an offset arrangement.

Meanwhile, logic circuits (a memory, CPU, control circuit, signal division circuit, correction circuit, etc.) besides the driver circuits, although not shown in FIG. 2, are formed at areas other than those having source and gate drivers.

With such circuit configuration, a reflective type active matrix liquid crystal display device can be realized which is small in size.

Now described is one example of a method for manufacturing a reflective type active matrix liquid crystal display device of the present embodiment, with reference to FIGS. 3A to 3D, FIGS. 4A to 4D, FIGS. 5A to 5C and FIGS. 6A to 6C.

Figure 3A:
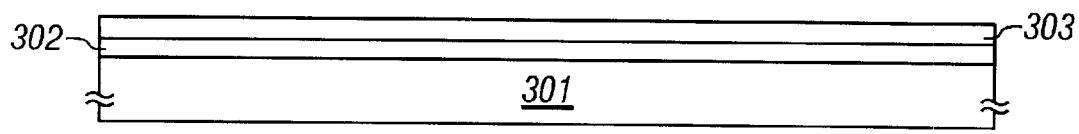
FIGS. 3A to 3D are process views of a method for manufacturing an active matrix liquid crystal display device of the reflective type semiconductor display device of the present invention.

Referring first to FIG. 3A, first prepared is a glass substrate 301 in a 12.5 cm square (e.g. Corning 1737 glass substrate). On this glass substrate 301, a silicon oxide film 302 is formed to a thickness of 2000 angstroms by plasma CVD with TEOS as a material. This thickness may naturally be determined as required. The silicon oxide film 302 serves as an underlying film to prevent impurities from diffusing or so from the glass substrate to a semiconductor film.

Then an amorphous silicon film 303 is formed by a plasma CVD technique. Although plasma CVD is employed herein, a low pressure thermal CVD technique may be applied. Incidentally, the thickness of the amorphous silicon film 303 is taken 550 angstroms. This thickness may naturally be determined as required. Then UV light is radiated over a surface of the amorphous silicon film 303, forming a thin oxide film (not shown).

Figure 3B:
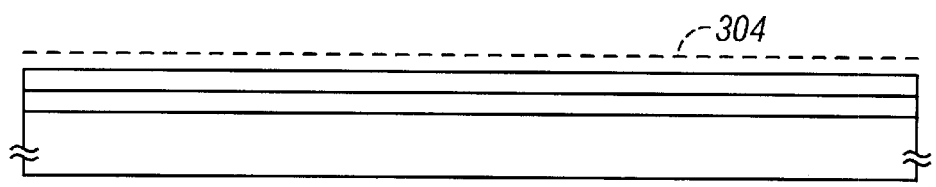

Referring to FIG. 3B, liquid-phase nickel acetate 304 is applied to over the surface of the amorphous silicon film 303 by a spin coat technique. The above oxide film is provided to enable the nickel acetate 304 to be applied homogeneously over the film surface. The element nickel serves to accelerate the amorphous silicon film to crystallize.

Figure 3C:
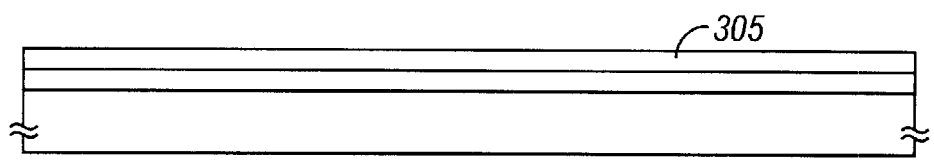

Then the amorphous silicon film is removed of hydrogen by placing in a nitrogen atmosphere held at a temperature of 450° C. to 500° C. (500° C. in this embodiment) for one hour. This is because unpaired bonds are intentionally formed in the amorphous silicon film to thereby decrease threshold energy for crystallization to be performed later. Thereafter, heat treatment is conducted in a nitrogen atmosphere at a temperature of 550° C. to 600° C. (550° C. in this embodiment) for 4 to 8 hours (4 hours in this embodiment), thereby crystallizing the amorphous silicon film. This crystallization was made at 550° C. due to the action of nickel element. During the heat treatment, the nickel element accelerate the silicon film to crystallize while moving around within the silicon film. In this manner, a polycrystalline silicon film 305 is obtained at a temperature of below 600° C. over the glass substrate (FIG. 3C). Further, the polycrystalline silicon film is annealed with laser, in order to enhance its crystallinity.

In the present method, nickel was applied to the entire surface of the amorphous silicon film. Alternatively, nickel may be selectively added onto the amorphous silicon film, causing crystal growth. In such a case, crystal growth is principally in a lateral direction.

Figure 3D:
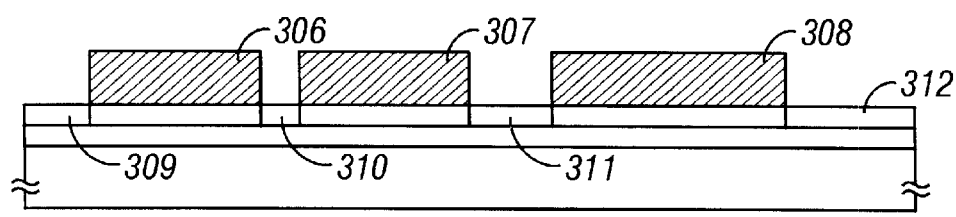

Next, performed is a process to remove nickel in the film. Referring to FIG. 3D, oxide film masks 306, 307 and 308 are first formed to a thickness of 1000 to 1300 angstroms (1300 angstroms in this embodiment). The masks are provided in order to carry out selective phosphorus doping. In this state phosphorus doping is carried out. Thereupon, phosphorus is doped into the polycrystalline silicon film 305 only at areas 309, 310, 311 and 312 not covered by the masks 306, 307 and 308 (these areas are referred to as phosphorus added areas 309, 310, 311 and 312). In this case, the doping acceleration voltage and the thickness of the mask comprising an oxide film are optimized in order not to allow phosphorus to substantially pass through the mask 306, 307 and 308. Although the mask 306, 307 and 308 are not necessarily of an oxide film, an oxide film is convenient because no contamination occurs even if directly contacted with an active layer.

The dose of phosphorus is preferably determined approximately from $1 \times 10^{14}$ to $1 \times 10^{15}$ ions/cm$^2$. In the present embodiment, phosphorus doping was conducted at a dose of $5 \times 10^{14}$ ions/cm$^2$ using an ion doping apparatus.

Incidentally, the acceleration voltage for ion doping was at 10 kV. With 10 kV acceleration voltage, phosphorus hardly passes through 1000 angstroms of the oxide film mask.

Figure 4A:
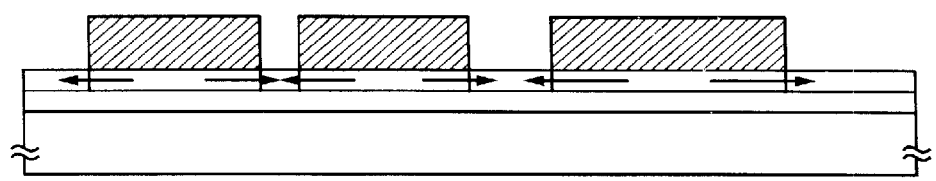
FIGS. 4A to 4D are process views of a method for manufacturing an active matrix liquid crystal display device of the reflective type semiconductor display device of the present invention.

Referring next to FIG. 4A, thermal anneal is thereafter carried out in an atmosphere at 600° C. for 1 to 12 hours (12 hours in this embodiment), to conduct nickel element getter. This causes nickel to be attracted to phosphorus as shown by arrows in FIG. 4A. At a temperature of 600° C., phosphorus atoms will not move about in the film whereas nickel atoms can move over a distance of approximately several hundred of $\mu$m or longer. It can be understood from this that nickel is one of the elements best suited for nickel getter.

Figure 4B:
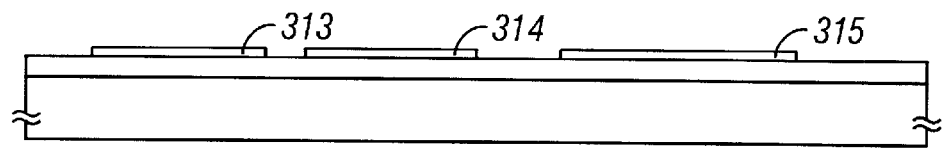

The polycrystalline silicon film 305 is then patterned. At this time, the patterning is such that no phosphorus added areas 309, 310, 311 and 312 or nickel gettered region is left. In this manner, active layers 313, 314 and 315 were obtained which contained almost no nickel element (FIG. 4B). The obtained polycrystalline silicon films 313, 314 and 315 are to be later formed into TFT active layers.

Next, a gate insulation film 316 is formed. In this embodiment a silicon oxide (SiO$_2$) film was formed as the gate insulating film 316 to 1500 angstroms by the plasma CVD technique (FIG. 4C).

Figure 4C:
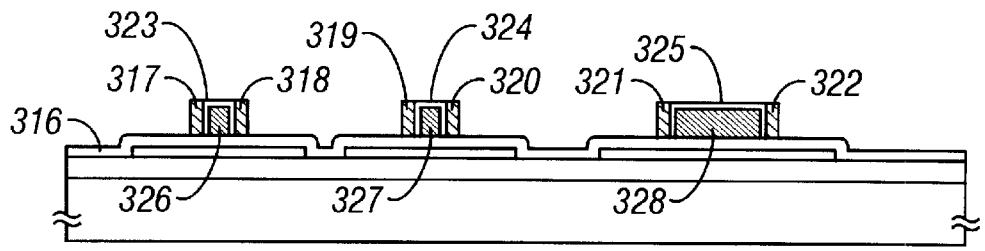
Figure 4D:
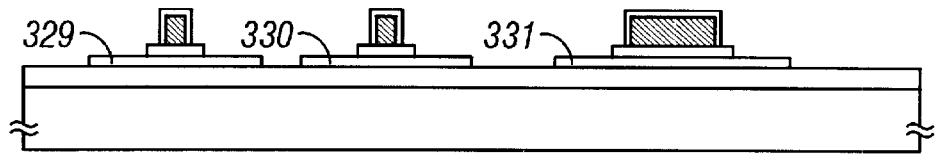

Referring now to FIG. 4C, a not-shown metal layer is formed which contains aluminum as a main ingredient. In this embodiment an aluminum film containing scandium by 2 wt % was used. Then an anodic oxide film is formed on a surface the metal film is exposed, by a known anodic oxidation method. The anodic oxide film and the metal film are patterned into a gate electrode previous form. Then, a known anode oxidation technique is carried out to form porous anode oxide films 317, 318, 319, 320, 321 and 322. By the known anodic oxidation technique, non-porous anode oxide films 323, 324 and 325 and gate electrodes 326, 327 and 328 are formed.

Then the gate dielectric film 316 is etched through masks of the gate electrodes 326, 327 and 328 and the porous anode oxide films 317, 318, 319, 320 321 and 322. The porous anode oxide films 317, 318, 319, 320, 321 and 322 are removed, obtaining a form of FIG. 4D. Note that in FIG. 4D those denoted at 329, 330 and 331 are gate insulation films after being formed.

Next is performed a process of adding an impurity element to provide one conductivity. The impurity element may use P (phosphorus) or As (arsenic) for an N-channel type, or B (boron) or Ga (gallium) for a P-channel type.

In this embodiment two impurity adding process steps are carried out to form TFTs for each of the N channel type and the P channel type.

Figure 5A:
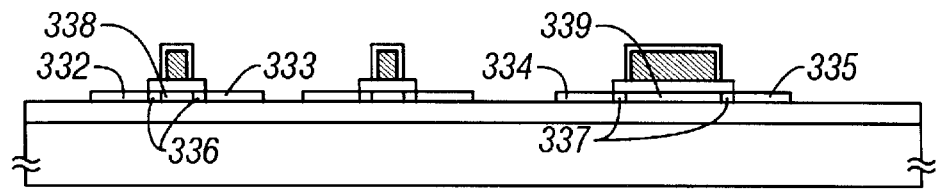
FIGS. 5A to 5C are process views of a method for manufacturing an active matrix liquid crystal display device of the reflective type semiconductor display device of the present invention.

At first, an impurity is added in order to form N channel type TFTs (FIG. 5A). First impurity addition (with P (phosphorus) in this embodiment) is performed at a high acceleration voltage of approximately 90 keV, forming an n$^-$ region. This n$^-$ region is controlled in phosphorus ion concentration to $1 \times 10^{18}$ atoms/cm$^3$ to $1 \times 10^{19}$ atoms/cm$^3$.

Further, second impurity adding is performed at a low acceleration voltage of approximately 10 kev, forming an n$^+$ region. At this time, the gate dielectric film acts as a mask because of low acceleration voltage. Also, the n$^+$ region is controlled to have a sheet resistance of 500 $\Omega$/square or lower (preferably 300 $\Omega$/square or lower). In this manner formed are source and drain regions 332, 333, 334 and 335 of N channel type TFT, low impurity concentration regions 336 and 337, and channel regions 338 and 339.

Figure 5B:
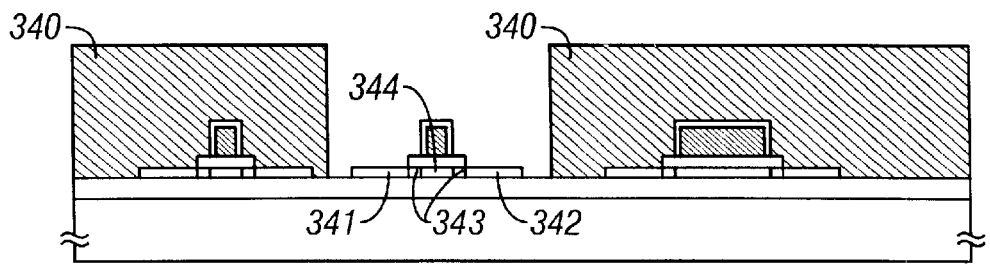

Then a resist mask 340 is provided to cover the N channel TFT, and an impurity ion (boron in this embodiment) is added to give a P-type (FIG. 5B).

This process is performed divisionally two times similarly to the above impurity adding process. However, the concentration of boron ion added is about several times higher than the concentration of the phosphorus ions, because there is a necessity of reversing the N-channel into the P-channel. In this manner formed are source and drain regions 341 and 342 of P-channel type TFT, a low impurity concentration region 343, and a channel region 344 (FIG. 5B).

After completing an active layer as above, impurity ions are activated by furnace anneal, laser anneal, ramp anneal and the like. This restores active layer damaged in the impurity adding process.

Figure 5C:
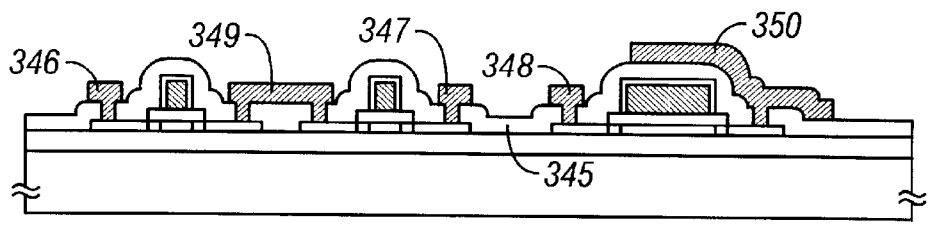

Then a film having an overlying silicon nitride film (250 angstroms) and silicon nitride film (9000 angstroms) is formed as a first interlayer insulation film 345, and contact holes are formed therethrough. Thereafter, source electrodes 346, 347 and 348 and drain electrodes 349 and 350 are formed by a metal film of a three layer structure Ti/Al/Ti (FIG. 5C). Note that the first interlayer insulation film 345 may use an organic resin film.

Figure 6A:
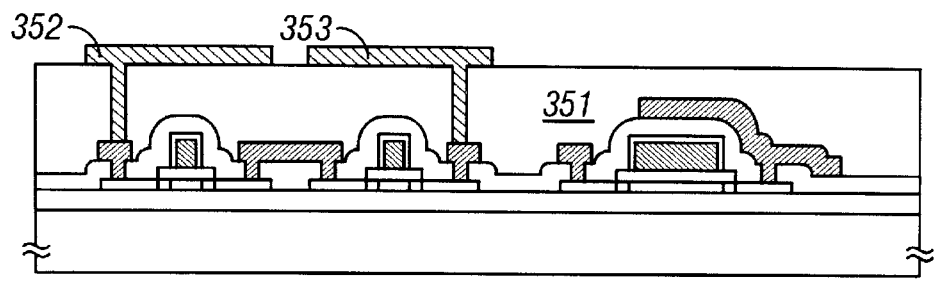
FIGS. 6A to 6C are process views of a method for manufacturing an active matrix liquid crystal display device of the reflective type semiconductor display device of the present invention.

Referring to FIG. 6A, a second interlayer insulation film 351 of an organic resin film is formed to a thickness of 0.5 to 3 $\mu$m. In this embodiment, polyimide is used in the second interlayer insulation film. The organic resin film may employ polyimide, acrylic, polyimide-amide, and so on. The advantages of inorganic resin film include easy film formation, easy increase of film thickness, and reducible parasitic capacity due to low relative dielectric constant. Incidentally, it is possible to use other organic resin films than that described above.

Next, contact holes are formed through the second insulation layer to third interconnects 352 and 353 to source and drain electrodes of P-channel type and N-channel type TFTs for constituting driver circuits, control circuits and other peripheral circuits (FIG. 6A). In this embodiment, the third interconnects 352 and 353 used the same material as that of the source and drain electrodes. Note that the third interconnects 352 and 353 may use other metals.

Figure 6B:
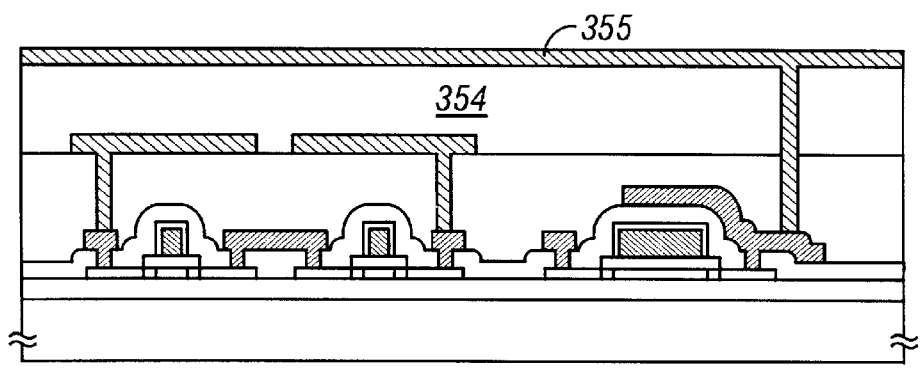

Then, a third interlayer insulation film 354 of an organic resin film is formed to a thickness of 0.5 to 3 $\mu$m (FIG. 6B). In this embodiment, polyimide is used in the third insulation layer. This organic resin film may use polyimide, acrylic resin, polyimide-amide or the like. Incidentally, it is possible to use other organic resin films than that described above.

Next, a contact hole reaching a pixel TFT drain electrode is formed to provide a reflective pixel electrode 355 connected to the pixel TFT drain electrode. In this embodiment, aluminum is used in the reflective pixel electrode 355.

The entire substrate is then heated at 350° C. in a hydrogen atmosphere for 1 to 2 hours to conduct hydrogenation for an overall device, thereby compensating for dangling bonds (unpaired bonds) in the film (particularly in the active layer). Through the above process, a CMOS circuit comprising N-channel type and P-channel type TFTs and pixel TFTs are formed on the common substrate. In this manner, an active matrix substrate is manufactured for an active matrix liquid crystal display device of the present embodiment (FIG. 6B).

The pixel TFT may be formed in a triple gate electrode structure. By doing so, OFF current through the pixel TFTs can be decreased.

Now a process for manufacturing an active matrix liquid crystal device is described on the basis of the active matrix substrate formed through the above process.

An alignment film 356 is formed on the active matrix substrate in the state of FIG. 6B. In this embodiment, polyimide is used in the alignment film 356. Then an opposite substrate is prepared. The opposite substrate is structured by a glass substrate 357, an opposite electrode 358 formed by a transparent conductive film, and an alignment film 359.

In this embodiment, a polyimide film is used in the alignment film for causing liquid crystal molecules to align perpendicular to the substrate. After alignment film forming, rubbing is carried out to give a constant pretilt angle to liquid crystal molecules for vertical alignment.

Figure 6C:
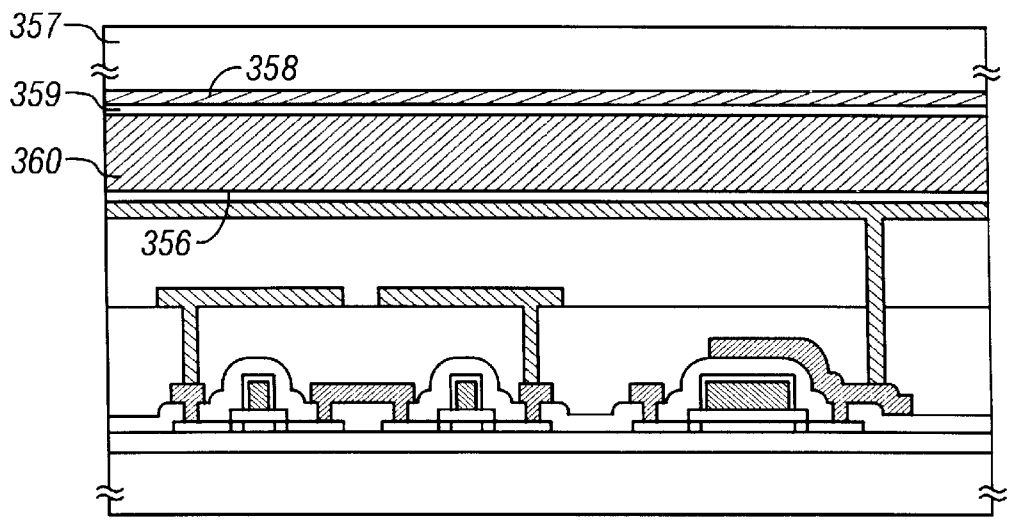

Then, the active matrix substrate and the opposite substrate formed through the above process are bonded together through a seal material and spaces (both not shown) by a known cell making process. Thereafter liquid crystal material 360 is filled between the two substrates and then sealed by a sealing agent (not shown). Thus an transparent-type active matrix liquid crystal device is completed as shown in FIG. 6C.

In this embodiment, the liquid crystal panel was made to display in an ECB (electric field controlled birefringence) mode. For this reason a polarizing plate (not shown) was placed on the active matrix liquid crystal display device.

Figure 10:
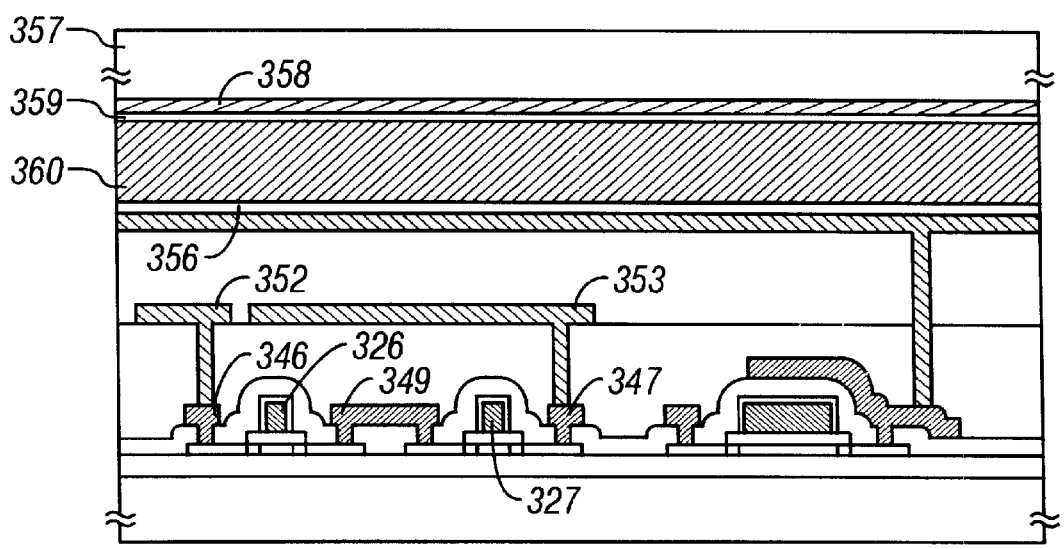
FIG. 10 is a sectional view of an active matrix liquid crystal display device according to a reflective type semiconductor display device of the present invention.
Figure 11:
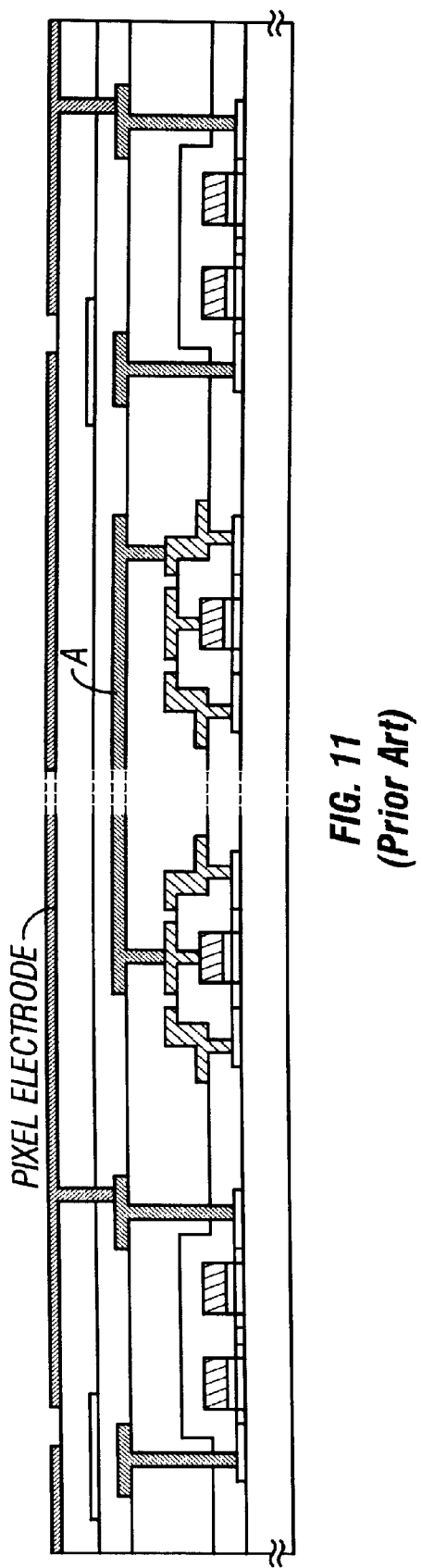
FIG. 11 is a sectional view of an active matrix substrate of a conventional reflective type semiconductor display device.

It is preferred for the reflective-type active matrix liquid crystal display device in this embodiment to form the third interconnects 352 and 353 to cover over the drain electrode 349 or the source electrodes 346 and 347 or the gate electrodes 326 and 327 as shown in FIG. 10. This is because to enhance the shield effect for the third interconnects 352 and 353 against electricity noise to be caused by source, drain or gate interconnects of the driver TFTS.

In the reflective-type active matrix liquid crystal display device, there is a possibility to form a capacitance between the third interconnects and the reflective pixel electrode at a location beneath the reflective pixel electrode over the driver TFTs. Accordingly, a dummy (floating) third interconnect is preferably formed in a region having no driver TFTs so that a capacitance difference is prevented from occurring between the region with the driver TFTs and the region without driver TFTs due to a large difference in a sum of areas of the third interconnects.

Embodiment 2

Figure 7:
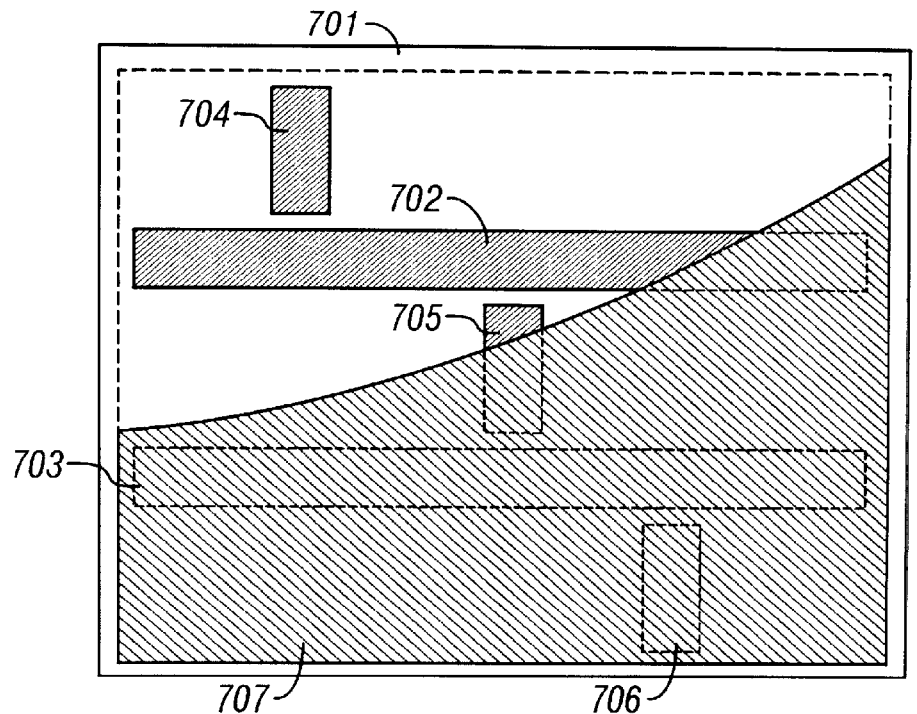
FIG. 7 is a top view of an active matrix substrate of an active matrix liquid crystal display device according to a reflective type semiconductor display device of the present invention.

This embodiment has an arrangement of source and gate drivers different from those of Embodiment 1. FIG. 7 shows a top plan view of an active matrix substrate for a reflective-type active matrix liquid crystal display device according to the present invention. Note that in also FIG. 7 the figure is partly depicted as a projection view for an explanatory sake.

In FIG. 7, 701 is an active matrix substrate, 702 and 703 are source drivers, 704, 705 and 706 are gate drivers, and 707 is a reflective pixel electrode region connected to pixel TFTs for constituting an active matrix circuit. As shown in FIG. 7, the reflective-type active matrix liquid crystal display device in this embodiment has the gate driver that is divided into three regions 704, 705 and 706.

In this manner, the reflective type active matrix liquid crystal display device of the invention is comparatively free in arranging the driver circuit. With the driver arrangement in this embodiment, the TFT array is divided in drive which enables time division drive and multi-point simultaneous drive.

Embodiment 3

In this embodiment, the mask was removed and laser irradiation was conducted in the process step of FIG. 3D of the manufacturing method of Embodiment 1, in order to activate phosphorus within the active layer.

The laser irradiation employed excimer laser with which high output is available. The excimer laser used a linearly formed beam to increase operation speed. Specifically, a laser beam having 0.5 mm width and 12 cm length was formed by the excimer laser with a predetermined lens group. The beam is scanned relative to the substrate in a width direction of the linear beam. Thus, laser irradiation was conducted throughout the entire substrate surface.

The similar effect was obtained with other kinds of excimer laser, for example XeCl excimer laser. Also, the effects as similar with a laser beam formed not in linear. The phosphorus thus activated had a sheet resistance of approximately 2 k$\Omega$/square.

The process thereafter is similar to Embodiment 1.

According to the manufacturing method of this embodiment, the electric force of activated phosphorus improves and enhances the gettering of catalytic element, such as nickel. Nickel, on the other hand, receives energy for phosphorus activation and diffuses nickel silicide to the film. Thus, nickel is in a state more ready to be gettered.

Embodiment 4

This embodiment demonstrate a process replacing by RTA the laser irradiation process for improving the gettering shown in Embodiment 3.

RTA is an abbreviation of Rapid Thermal Annealing. A light source of the RTA is typically represented by a halogen lamp, to emit principally an infrared portion of light, which can heat up only a film formed on a substrate surface.

However, it is impossible to reduce the heating time shorter than that by laser. The substrate is somewhat heated due to such a cause that the wavelength range is principally in the infrared region. The excimer laser light is ultraviolet light.

Accordingly, it is difficult to provide high energy to the film as compared to laser. However, energy is stable higher than that of laser, enabling annealing with higher homogeneity. Also, RTA possesses ability to sufficiently give energy required in this embodiment to the active layer.

The RTA employed in this embodiment has a halogen lamp. The RTA used in this embodiment has a linear-formed beam light, enhancing operation efficiency. The operation method is similar to a method using linear laser. However, because operation time requires somewhat long unlike a laser case, there may be a case that the substrate cannot withstand abrupt temperature change and is fractured. Accordingly, the substrate needs to be raised in temperature before treatment.

In this embodiment, the temperature of the substrate is previously raised to 350 degrees and then irradiation was made with a halogen lamp while scanning to the substrate, in a manner similar to laser.

The similar effect was obtained by replacing the halogen lamp by an arc lamp. Also, the RTA light ray is not necessarily formed in a linear form. The laser irradiation process only of the manufacturing method shown in Embodiment 1 was replaced by an RTA process, and the obtained film had a sheet resistance of 5 kΩ/square. Thereafter, the process may be proceeded in a similar manner to Embodiment 1. The substrate manufactured in this embodiment had properties equivalent to that of Embodiment 1.

Embodiment 5

Although the reflective-type active matrix liquid crystal display devices were manufactured with top gate type TFTs in the manufacturing methods of Embodiments 1, 3 and 4, the reflective type active matrix liquid crystal display device of the invention may be structured with bottom gate type TFTs or inverted staggered type TFTs.

Embodiment 6

In Embodiments 1, 2, 3, 4 and 5, ECB using a nematic liquid crystal material was used as a display mode for the reflective type active matrix liquid crystal display device. However, other display mode may be employed.

Furthermore, the reflective type active matrix liquid crystal display device of the invention may be structured using an anti-ferroelectric liquid crystal or ferroelectric liquid crystal that are high in response speed without having threshold value.

In Embodiments 1, 2, 3, 4 and 5, explanations were made on the reflective type liquid crystal display devices as a reflective type display device of the present invention. However, the preset invention is applicable to a reflective type display device using any of the other display mediums whose optical characteristics can be modulated responsive to an application voltage. For example, an electroluminescent device may be used.

Embodiment 7

The reflective type liquid crystal display devices of Embodiments 1, 2, 3, 4, 5 and 6 have various applications. In this embodiment semiconductor devices are explained which incorporates the reflective type display device of the invention.

Such semiconductor devices includes a video camera, a digital camera, a rear type projector, a front type projector, a head-mount display (a goggle type display), a car navigation system, a personal computer, a portable information terminal (a mobile computer, a portable phone, etc.), and so on, one examples of which are shown in FIGS. 8A to 8H.

Figure 8A:
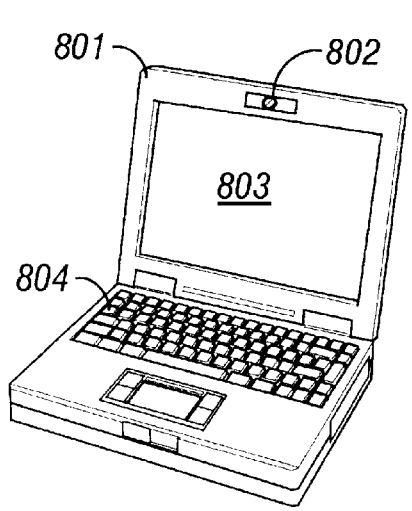

FIG. 8A shows a personal computer, which comprises a main body 801, an image input section 802, a reflective type display device 803 and a keyboard 804.

Figure 8B:
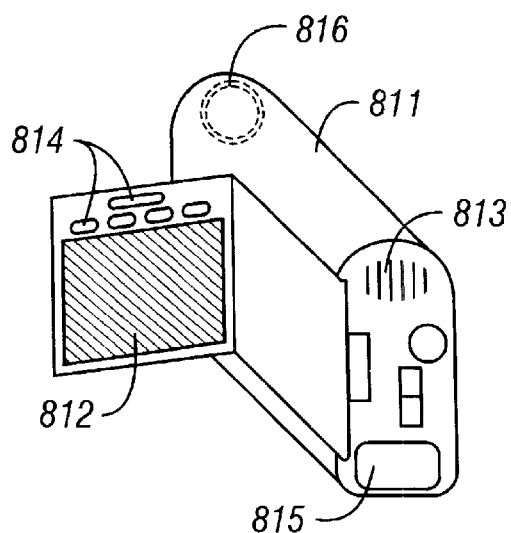
Figure 9:
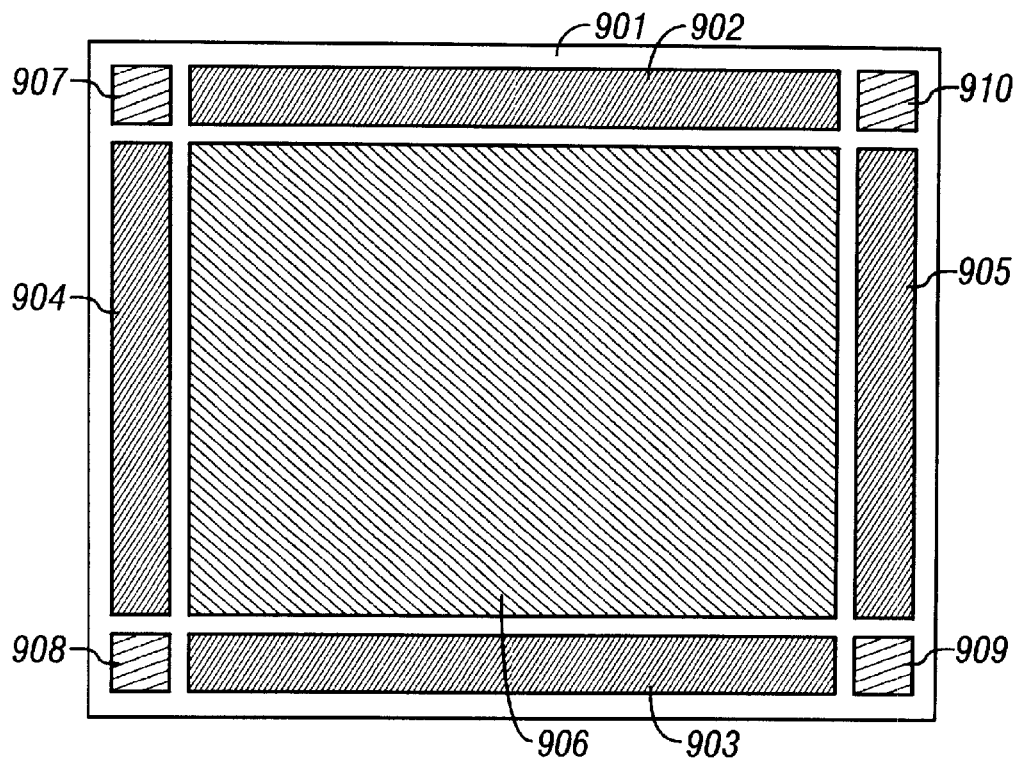
FIG. 9 is a top view of an active matrix substrate of a conventional semiconductor display device.

FIG. 8B shows a video camera, which comprises a main body 811, a reflective type display device 812, a sound input section 813, an operation switch 814, a battery 815 and an image receiving section 816.

FIG. 8C shows a mobile computer, which comprises a main body 821, a camera section 822, an image receiving section 823, an operation switch 824 and a reflective type display device 825.

FIG. 8D shows a goggle type article, which comprises a main body 831, a pair of reflective type display devices 832 and an arm section 832.

FIG. 8E shows a player apparatus equipped with a recording medium for recording a program (hereinafter, called a recording medium). The player apparatus comprises a main body 841, a reflective type display device 842, a speaker section 843, a recording medium 844 and an operation switch 845. A DVD (Digital Versatile Disc), a CD (Compact Disc) and the like are used as the recording medium of the player apparatus, and we can appreciate music, movie, playing a game and Internet.

FIG. 8F shows a digital camera, which comprises a main body 851, a reflective type display device 852, an eyepiece section 853, an operation switch 854 and an image receiving section (not shown).

FIG. 8G shows a rear type projector, which comprises a main body 861, a light source 862, a reflective type display device 863, a polarizing light beam splitter 864, reflectors 865 and 866 and a screen 867. Incidentally, the rear type projector is preferred because the screen angle can be changed with the main body kept fixed, depending on a viewer's position. It is possible to realize a rear type projector having a higher resolution and definition by using three (corresponding to Red, Green, Blue of light) of reflective type display devices 863.

FIG. 8H shows a front type projector, which comprises a main body 871, a light source 872, a reflective type display device 873, an optical system 874 and a screen 875. Incidentally, it is possible to realize a front type projector having a higher resolution and definition by using three (corresponding to Red, Green, Blue of light) of reflective type display devices 873.

According to the present invention, in a reflective type display device driver circuits or other logic circuits can be formed underneath a reflective pixel electrode of a TFT array. Moreover, the power source interconnects for the driver circuits and other logic circuits formed underneath the pixel electrode are used as third interconnects, the reflective pixel electrode can be prevented against the influence of electrical noise caused by a clock signal and a data signal flowing through these circuits. Accordingly, a reflective type semiconductor display device is provided which is high in definition, resolution and image quality despite it is small in size as compared to the conventional reflective semiconductor display device.

What is claimed is:

1. A reflective type display device comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTS of said driver circuit including a source electrode and a drain electrode;

a reflective pixel electrode connected to one of said pixel TFTs and arranged above at least part of said driver circuit; and a power source interconnect connected to one of said source electrode and said drain electrode and formed between said reflective pixel electrode and one of said source electrode and said drain electrode.

2. A reflective type display device according to claim 1 wherein said reflective type display device is an active matrix type liquid crystal display device.

3. A reflective type display device according to claim 1 wherein said reflective pixel electrode comprises aluminum.

4. A reflective type display device comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTs of said driver circuit including a source electrode and a drain electrode;

a logic circuit formed over said insulation substrate;

a reflective pixel electrode connected to one of said pixel TFTs and arranged above at least part of said driver circuit or at least part of said logic circuit; and a power source interconnect connected to one of said source electrode and said drain electrode and formed between said reflective pixel electrode and one of said source electrode and said drain electrode.

5. A reflective type display device according to claim 4 wherein said reflective type display device is an active matrix type liquid crystal display device.

6. A reflective type display device according to claim 4 wherein said reflective pixel electrode comprises aluminum.

7. A reflective type semiconductor display device according to claim 4 wherein said logic circuit is formed by at least one of a memory circuit, a correction circuit, a processor circuit and a signal dividing circuit.

8. A personal computer comprising a main body, an image input section, a reflective type display device and a keyboard, said reflective type display device comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTs of said driver circuit including a source electrode and a drain electrode;

a reflective pixel electrode connected to one of said pixel TFTs and arranged above at least part of said driver circuit; and a power source interconnect connected to one of said source electrode and said drain electrode and formed between said reflective pixel electrode and one of said source electrode and said drain electrode.

9. A personal computer according to claim 8 wherein said reflective type display device is an active matrix type liquid crystal display device.

10. A personal computer according to claim 8 wherein said reflective pixel electrode comprises aluminum.

11. A video camera comprising a main body, a reflective type display device, a sound input section, an operation switch, a battery and an image receiving section, said reflective type display device comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTs of said driver circuit including a source electrode and a drain electrode;

a reflective pixel electrode connected to one of said pixel TFTs and arranged above at least part of said driver circuit; and a power source interconnect connected to one of said source electrode and said drain electrode and formed between said reflective pixel electrode and one of said source electrode and said drain electrode.

12. A video camera according to claim 11 wherein said reflective type display device is an active matrix type liquid crystal display device.

13. A video camera according to claim 11 wherein said reflective pixel electrode comprises aluminum.

14. A mobile computer comprising a main body, a camera section, an image receiving section, an operation switch and a reflective type display device, said reflective type display device comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTs of said driver circuit including a source electrode and a drain electrode;

a reflective pixel electrode connected to one of said pixel TFTs and arranged above at least part of said driver circuit; and a power source interconnect connected to one of said source electrode and said drain electrode and formed between said reflective pixel electrode and one of said source electrode and said drain electrode.

15. A mobile computer according to claim 14 wherein said reflective type display device is an active matrix type liquid crystal display device.

16. A mobile computer according to claim 14 wherein said reflective pixel electrode comprises aluminum.

17. A goggle type article comprising a main body, a pair of reflective type display devices and an arm section, one of said reflective type display devices comprising:

an insulation substrate;

a TFT array formed over said insulation substrate and having a plurality of pixel TFTs formed in a matrix form;

a driver circuit formed over said insulation substrate and having a plurality of TFTs to drive said TFT array, each of said TFTs of said driver circuit including a source electrode and a drain electrode;

a reflective pixel electrode connected to one of said pixel TFTs and arranged above at least part of said driver circuit; and a power source interconnect connected to one of said source electrode and said drain electrode and formed between said reflective pixel electrode and one of said source electrode and said drain electrode.

18. A goggle type article according to claim 17 wherein said reflective type display device is an active matrix type liquid crystal display device.

19. A goggle type article according to claim 17 wherein said reflective pixel electrode comprises aluminum.

20. A player apparatus comprising a main body, a reflective type display device, a speaker section, a recording medium and an operation switch, said reflective type display device comprising:
  an insulation substrate;
  a TFT array formed over said insulation substrate and having a plurality of pixel TFTs formed in a matrix form;
  a driver circuit formed over said insulation substrate and having a plurality of TFTs to drive said TFT array, each of said TFTs of said driver circuit including a source electrode and a drain electrode;
  a reflective pixel electrode connected to one of said pixel TFTs and arranged above at least part of said driver circuit; and
  a power source interconnect connected to one of said source electrode and said drain electrode and formed between said reflective pixel electrode and one of said source electrode and said drain electrode.

21. A player apparatus according to claim 20 wherein said reflective type display device is an active matrix type liquid crystal display device.

22. A player apparatus according to claim 20 wherein said reflective pixel electrode comprises aluminum.

23. A digital camera comprising a main body, a reflective type display device, an eyepiece section, an operation switch and an image receiving section, said reflective type display device comprising:
  an insulation substrate;
  a TFT array formed over said insulation substrate and having a plurality of pixel TFTs formed in a matrix form;
  a driver circuit formed over said insulation substrate and having a plurality of TFTs to drive said TFT array, each of said TFTs of said driver circuit including a source electrode and a drain electrode;
  a reflective pixel electrode connected to one of said pixel TFTs and arranged above at least part of said driver circuit; and
  a power source interconnect connected to one of said source electrode and said drain electrode and formed between said reflective pixel electrode and one of said source electrode and said drain electrode.

24. A digital camera according to claim 23 wherein said reflective type display device is an active matrix type liquid crystal display device.

25. A digital camera according to claim 23 wherein said reflective pixel electrode comprises aluminum.

26. A rear type projector comprising a main body, a light source, at least one reflective type display device, a polarizing light beam splitter, at least one reflector and a screen, said reflective type display device comprising:
  an insulation substrate;
  a TFT array formed over said insulation substrate and having a plurality of pixel TFTs formed in a matrix form;
  a driver circuit formed over said insulation substrate and having a plurality of TFTs to drive said TFT array, each of said TFTs of said driver circuit including a source electrode and a drain electrode;
  a reflective pixel electrode connected to one of said pixel TFTs and arranged above at least part of said driver circuit; and
  a power source interconnect connected to one of said source electrode and said drain electrode and formed between said reflective pixel electrode and one of said source electrode and said drain electrode.

27. A rear type projector according to claim 26 wherein said reflective type display device is an active matrix type liquid crystal display device.

28. A rear type projector according to claim 26 wherein said reflective pixel electrode comprises aluminum.

29. A front type projector comprising a main body, a light source, at least one reflective type display device, an optical system and a screen, said reflective type display device comprising:
  an insulation substrate;
  a TFT array formed over said insulation substrate and having a plurality of pixel TFTs formed in a matrix form;
  a driver circuit formed over said insulation substrate and having a plurality of TFTs to drive said TFT array, each of said TFTs of said driver circuit including a source electrode and a drain electrode;
  a reflective pixel electrode connected to one of said pixel TFTs and arranged above at least part of said driver circuit; and
  a power source interconnect connected to one of said source electrode and said drain electrode and formed between said reflective pixel electrode and one of said source electrode and said drain electrode.

30. A front type projector according to claim 29 wherein said reflective type display device is an active matrix type liquid crystal display device.

31. A front type projector according to claim 29 wherein said reflective pixel electrode comprises aluminum.

* * * * *